United States Patent [19]

Greer et al.

[11] Patent Number: 5,099,195

[45] Date of Patent: Mar. 24, 1992

[54] ELECTRONIC DEVICE FOR MEASURING ELECTRICAL POWER SUPPLY TO A LOAD

[75] Inventors: Nigel P. J. Greer, Edinburgh; Alan J. Jones; Timothy R. Joyce, both of Staffordshire, all of United Kingdom

[73] Assignee: The General Electric Company, p.l.c., England

[21] Appl. No.: 628,477

[22] Filed: Dec. 14, 1990

[30] Foreign Application Priority Data

Dec. 18, 1989 [GB] United Kingdom ............... 8928494

[51] Int. Cl.⁵ ........................................... G01R 21/00
[52] U.S. Cl. ................................. 324/142; 324/103 R; 324/107
[58] Field of Search ................... 324/142, 141, 140 R, 324/107, 103 R, 78 E; 364/483, 481, 841, 842; 307/265; 328/160

[56] References Cited

U.S. PATENT DOCUMENTS

| | | | |
|---|---|---|---|
| 4,055,804 | 10/1977 | Mayfield | 324/142 |
| 4,378,524 | 3/1983 | Steinmuller | 324/142 |
| 4,706,066 | 11/1987 | Dijkmans | 324/78 E |
| 4,752,731 | 6/1988 | Toda | 324/142 |
| 4,786,863 | 11/1988 | Milkovic | 324/142 |
| 4,795,974 | 1/1989 | Landman et al. | 324/142 |
| 4,920,312 | 4/1990 | Maruyama | 324/142 |

*Primary Examiner*—Kenneth A. Wieder
*Assistant Examiner*—Vinh P. Nguyen
*Attorney, Agent, or Firm*—Kirschstein, Ottinger, Israel & Schiffmiller

[57] ABSTRACT

An electrical power measuring device wherein signals ($V_i$, $V_v$) representing one of the current and voltage supplied to a load are applied to the input of a sigma delta modulator (9), and the state (0 or 1) of the modulator output together with the polarity of the other one of the voltage and current values, is used to determine the sense in which the digital signals representative of successive samples of the other one of voltage and current values are accumulated in an accumulator (11). The count in the accumulator (11) consequently increases at a rate representative of the power supplied to the load.

8 Claims, 2 Drawing Sheets

ELECTRONIC DEVICE FOR MEASURING ELECTRICAL POWER SUPPLY TO A LOAD

BACKGROUND OF THE INVENTION

This invention relates to electrical power measuring devices.

More especially the invention relates to electrical power measuring devices of the kind employing throughout electronic devices, i.e. avoiding the use of mechanical devices such as a Ferraris disc and associated gearing.

Such devices are, of course, suitable for fabrication in integrated circuit form, but some device architectures are less suitable for such fabrication than others.

SUMMARY OF THE INVENTION

It is an object of the present invention to provide an electrical power measuring device whose architecture is such as to render the device particularly suitable for fabrication in integrated circuit form.

According to the present invention there is provided an electrical power measuring device comprising: input means for producing first and second analogue signals respectively representative of the instantaneous values of the voltage and current supplied to a load; modulator means for producing in response to one of said first and second analogue signals, a signal which during periods of equal duration has a first or a second value such that the ratio of the number of the periods of the first value to the number of periods of the second value over an interval varies with the value of said one of the first and second analogue signals; means for producing a digital signal representative of the value of the other of said first and second analogue signals; and accumulator means which in response to the output of said modulator means during each said period accumulates the magnitude of said digital signal during that period in a sense dependent on the value of the output of the modulator and the polarity of said other of said first and second analogue signals, as represented by said digital signal.

BRIEF DESCRIPTION OF THE DRAWINGS

One electric power measuring device in accordance with the invention will now be described, by way of example, with reference to the accompanying drawings in which.

DETAILED DESCRIPTION OF THE PREFERRED EMBODIMENTS

Figure 1:
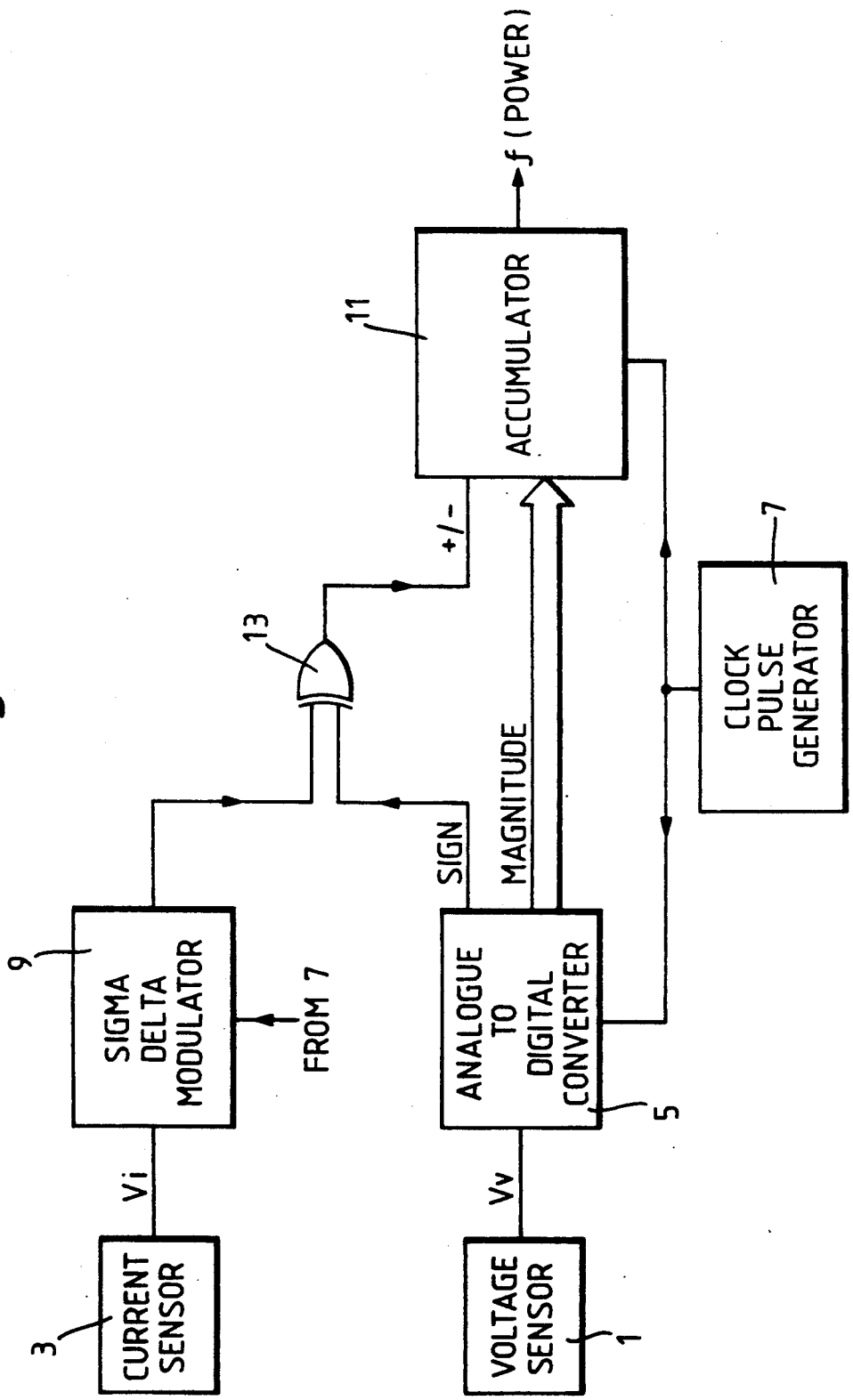
FIG. 1 is a block schematic diagram of the device.

Referring to FIG. 1, the device includes a voltage sensor 1 and a current sensor 3 which respectively produce analogue outputs Vv and Vi respectively representative of the instantaneous values of the voltage and current supplied to a load (not shown) from an alternating current electricity supply (not shown).

The voltage representative output of the sensor 1 is applied to an analogue-to-digital converter 5 wherein it is sampled at regular intervals under control of pulses derived from a clock pulse generator 7 to produce a binary coded digital representation of the magnitude of the output of the sensor 1, and hence of the instantaneous value of the voltage supplied to the load, and a further bit representative of the polarity of the voltage.

The clock pulse frequency is of course high compared with the a.c. supply frequency, e.g. 66 kHz for a 50 Hz supply.

The current representative output of the sensor 3 is applied to a sigma delta modulator 9. The modulator 9, under control of pulses from the clock pulse generator 7, produces an output which during each clock pulse period has a first or second value, i.e. '0' or '1', dependent on the magnitude of the output of the sensor 3, and hence on the instantaneous value of the current supplied to the load. When the instantaneous value is zero the modulator output has values of 0 and 1 during alternate clock periods. When the instantaneous value progressively increases from zero in one sense the modulator output has a value '1' progressively more often than a value '0'. Similarly, as the instantaneous value progressively increases from zero in the other sense the modulator output has a value '0' progressively more often than a value '1'.

The voltage magnitude representative output of the A-D converter 5 is supplied to an accumulator 11 and the voltage sign representative output bit is supplied to one input of an exclusive -OR gate 13. The output of the modulator 9 is supplied to the other input of the gate 13.

The accumulator 11 is arranged to add the voltage magnitude representative output of the converter 5 to, or to subtract it from, the count in the accumulator 11 in dependence on the output of the gate 13, once during each clock period. As a result, the count in the accumulator 11 changes in any given interval by the output of the converter 5 times the number of times more in that interval that the output of the modulator 9 had one value rather than the other. The count in the accumulator 11 thus changes at a rate representative of the sum of the products of the instantaneous voltage and current supplied to the load at the instants of sampling the voltage, i.e. at a rate representative of the power supplied to the load.

The accumulator 11 produces an output pulse each time the count of the accumulator 11 exceeds a predetermined value, the count of the accumulator 11 then being reset. The reset operation comprises reducing the count of the accumulator by a predetermined amount, not to zero. This avoids loss of the data represented by the amount by which the accumulator count exceeds the predetermined value at reset. The output of the accumulator 11 thus comprises a train of pulses whose pulse rate is representative of the power supplied to the load. This pulse train is typically supplied to a counter (not shown) to provide a measure of the energy supplied to the load.

An arrangement of the form shown in FIG. 1 has the advantage that a sigma delta modulator of sufficient dynamic range to accommodate likely variation in the current supplied to the load can be fabricated in integrated circuit form so as to occupy a relatively small area. Moreover, a sigma delta modulator gives an output in the form of a single bit stream which can very easily be combined with a digital representation of voltage to produce a power representative signal using an accumulator, which can also be fabricated in integrated circuit form so as to occupy a relatively small area. In addition the accumulator filters out all but the required d.c. power component and acts as a d.c. power to frequency converter.

Figure 2:
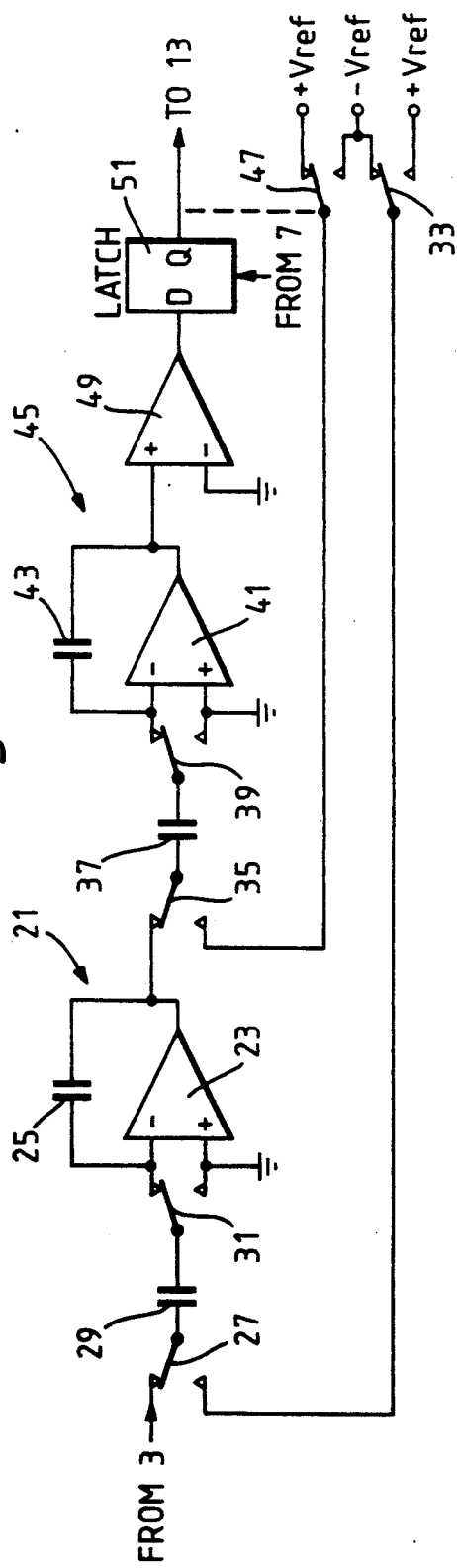
FIG. 2 is a diagram illustrating one possible form of a sigma delta modulator forming part of the device.

One suitable form for the sigma delta modulator 9 of FIG. 1 is shown in FIG. 2.

The modulator of FIG. 2, which is a second order sigma delta modulator, includes a first integrator 21 comprising an operational amplifier 23 and feedback capacitance 25, the amplifier 23 having its positive input grounded.

The output of the current sensor 3 is connected to one fixed contact of a two-way switch 27 whose movable contact is connected via a capacitor 29 to the movable contact of a second two-way switch 31 which has one fixed contact connected to the negative input of the amplifier 23 and the other connected to ground. The other fixed contact of the switch 27 is selectively connectable to a negative reference voltage −Vref or a positive reference voltage +Vref by way of a third two-way switch 33, the two reference voltages being of equal magnitude.

It will be appreciated that the switches 27, 31 and 33, and further switches described below, whilst being illustrated and described, for simplicity, as having mechanical contacts, will in practice be electronic switches and implemented, for example, in MOS technology form.

The output of the integrator 21 is connected to one fixed contact of a fourth two-way switch 35 whose movable contact is connected via a capacitor 37 to the movable contact of a fifth two-way switch 39.

One fixed contact of the switch 39 is connected to the negative input of a second operational amplifier 41 which forms with a feedback capacitance 43 a second integrator 45, the positive input of the amplifier 41 and the other fixed contact of the switch 39 being grounded. The other fixed contact of the switch 35 is selectively connectable by way of a sixth two-way switch 47 to either the negative reference voltage −Vref or the positive reference voltage +Vref, operation of the switches 33 and 47 being phased so that the reference voltages applied to switches 27 and 35 are of opposite polarity.

The output of the integrator 45 is connected to the positive input of a comparator 49 whose negative input is grounded. The output of the comparator 49 is temporarily stored in a clocked latch 51, whose output constitutes the output of the modulator. The switches 27, 31, 35 and 39 are controlled in synchronism by clock pulses derived from the generator 7 so as to be in the positions shown in FIG. 2 during each of one set of alternate clock periods and their other positions during each of the other set of alternate clock periods. The switches 33 and 47 are operated in dependence on the output of the latch 51, being in the positions shown in FIG. 2 when the latch output is '0' and their other positions when the latch output is '1'. The capacitors 25, 29, 37 and 43 are all of the same value.

In operation, with a zero voltage input from the current sensor 3, the circuit rapidly assumes a state wherein the capacitors 29 and 37 each charge and discharge during each pair of successive clock periods by the same amount so that output of the comparator 49 changes state during each clock period and the output of the latch 51 is altenatively '0' and '1' during successive clock periods. When the input from the current sensor 3 has a finite value the capacitor 29 and hence the capacitor 37 charges during clock periods when the switches 27, 31, 35 and 39 are in the positions shown in FIG. 2 by more or less than they charge in the other clock periods. As a result, the comparator 49 will periodically not change its state during a clock period and the latch 51 will periodically remain in the same state for two successive clock periods, this phenomenon occurring more frequently, the greater the magnitude of the modulator output.

In a practical embodiment of the circuit of FIG. 2, the circuit is preferably made fully differential to maximise power supply rejection and charge injection cancellation.

Since the transfer function of each of the integrators 21 and 45 of FIG. 2 may be expressed using the Z transform notation as $H(z)=1/(1-z^{-1})$, the transfer function of the whole modulator is:

$$Y(z)=X(z)+(1-z^{-1})^2Q(z)$$

where $Q(z)$ is the quantisation noise introduced by the comparator 49. Thus the spectrum of the single bit digital signal at the output of the modulator consists of the desired signal plus quantisation noise modified by the noise transfer function (NTF), $(1-z^{-1})^2$. The NTF is, in fact, a high pass filter function which for power supply frequencies f well below the clock frequency $fc=1/T$ approximates to $(2\pi fT)^2$. If the clock frequency is great enough, the amplitude of quantisation noise within the signal bandwidth becomes very small and high resolution is attained. This technique is known as oversampling noise shaping.

In sigma delta modulators used in communication systems, the bit stream from the modulator is passed through digital filters which reject the quantisation noise and give a high resolution multi-bit output at a lower sampling frequency. In such systems the bandwidth is many kHz and a linear phase response must be maintained. Hence the digital filters occupy a large area, much more than the modulator itself. In a device according to the present invention no such filtering is required because the quantisation noise is rejected by the accumulator after the voltage/current multiplication required for power measurement has been performed.

The voltage and current sensors 1 and 3 may take various forms. For example the voltage sensor may comprise a voltage divider connected across the supply and the current sensor may comprise a so-called current shunt in a supply lead, i.e. a very small value resistor in a supply lead. Alternatively a sensor 1 or 3, more especially current sensor 3, may be of the kind which provides an output proportional to the differential of the sensed quantity. It will then, of course, be necessary either to integrate the differential representative output, or the output of the other sensor prior to further processing.

Figure 3:
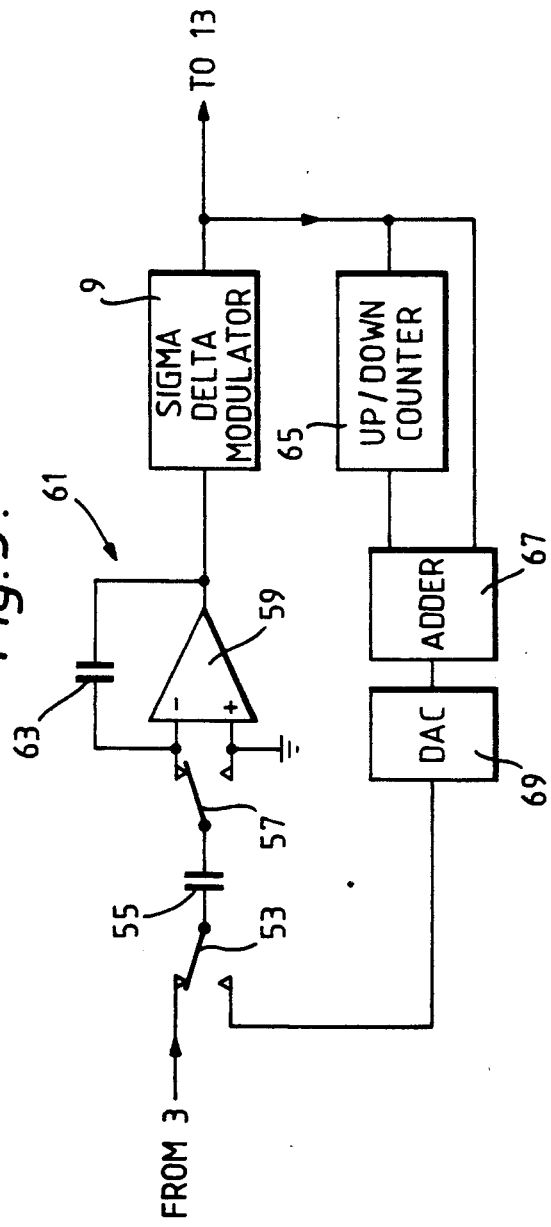
FIG. 3 illustrates a modification of the device.

FIG. 3 illustrates a modification of the device of FIG. 1 for use with a differential output current sensor. In this modification the current sensor output is applied to one fixed contact of a two-way switch 53 whose movable contact is connected via a capacitor 55 to the movable contact of a further two-way switch 57 having one fixed contact connected to the negative input of an operational amplifier 59. The amplifier 59 forms an integrator 61 with a feedback capacitor 63, the positive input of the amplifier 59 and the other fixed contact of the switch 57 being connected to ground. The output of the integrator 61 is fed to the input of the sigma delta modulator 9, e.g. of the form shown in FIG. 2. The output of the modulator 9 is fed to an up/down counter 65 whose output is fed an adder 67. The output of the modulator 9 is also fed directly to the adder 67. The sum of the inputs to the adder 67 is fed to a digital to analogue converter 69 whose output is connected to the other fixed contact of the switch 53.

The switches 53 and 57 are operated in synchronism by clock pulses derived from the generator 7 so as to be in the positions shown in FIG. 3 during one set of alternate clock periods and in their other positions during the other set of alternate clock periods.

The integrator 61, of course, serves to convert the current sensor output to a current which varies with the value of the current supplied to the load.

The feedback path comprising the up/down counter 65, adder 67 and D-A converter 69 serves as a low pass filter to keep the integrator 61 stable at d.c. ensuring that the mean level of the output pulse stream from the sigma delta modulator 9 is zero. This serves to eliminate the effects of any offsets in amplifier 59 or in any of the components of the modulator 9.

The two effective integrators 61 and 65 would, without additional precaution, form an oscillator at some particular frequency. The connection bypassing counter 65 serves as a feed forward connection which effectively provides a resistive feedback path between the 'integrator' output and input and thereby modifies the effective phase shift to prevent loop oscillation.

The analogue equivalent of the aforementioned 'integrator' is an operational amplifier with resistive input and capacitor feedback. The aforementioned feed forward connection that bypasses counter 65 serves the same function as the feedback resistor in parallel with the feedback capacitor of the analogue equivalent that would be necessary for DC stabilisation.

By way of clarification it is pointed out that the switch/capacitor combinations 27/29/31, 35/37/39 and 53/55/57 in FIGS. 2 and 3 simulate resistors in known manner, this technique being known as switched capacitor technology. This technique has the advantage, when used in integrated circuits, that better matching can be obtained between the values of a pair of capacitors e.g. 25 and 29 than between the effective values of a resistor and a capacitor.

We claim:

1. An electrical power measuring device comprising: input means for producing first and second analogue signals respectively representative of the instantaneous values of the voltage and current supplied to a load; modulator means for producing, in response to one of said first and second analogue signals, an output modulator signal which during periods of equal duration has a first or a second value such that the ratio of the number of the periods of the first value to the number of periods of the second value over an interval varies with the value of said one of the first and second analogue signals; an analogue-to-digital converter connected to said input means for producing at a converter output, first and second output digital signals respectively representative of the magnitude and polarity of the other of said first and second analogue signals; and accumulator means connected to said converter output which, in response to the output modulator signal of said modulator means during each said period, accumulates said first digital signal during that period in a sense dependent on the value of the output modulator signal of the modulator means and the polarity of said other of said first and second analogue signals, as represented by said second digital signal, said accumulator means being operative to produce an output pulse each time the accumulator means reaches a predetermined count, thereby to produce an output power signal comprising pulses at a rate indicative of the power supplied to the load.

2. A device according to claim 1 wherein said modulator means comprises a sigma delta modulator.

3. A device according to claim 1 wherein said accumulator means accumulates said first digital signal in a sense dependent on the output of an exclusive -OR gate having as input signals said output modulator signal of the modulator means and said second digital signal.

4. A device according to claim 1 wherein said one of said first and second analogue signals is proportional to the differential of the one of the instantaneous current and voltage which it represents; and said one of said first and second analogue signals is applied to an input of said modulator means via an integrator means.

5. A device according to claim 4 including a low pass filter characteristic feedback path between an output of the modulator means and an input of said integrator means.

6. A device according to claim 5 wherein said feedback path comprises an up/down counter and a digital to analogue converter.

7. A device according to claim 6 including another feedback path extending directly between the output of the modulator means and the digital to analogue converter.

8. A device according to claim 1 wherein said one of said first and second analogue signals is proportional to the differential of the one of the instantaneous current and voltage which it represents; and said other of said first and second analogue signals is applied to said analogue-to-digital converter means via an integrator means.

* * * * *